United States Patent [19]

Matsuda et al.

[11] Patent Number: 5,603,764
[45] Date of Patent: Feb. 18, 1997

[54] PROCESS FOR CRYSTAL GROWTH OF III-V GROUP COMPOUND SEMICONDUCTOR

[75] Inventors: Yoshinobu Matsuda, Tsukuba; Masahiko Hata, Tsuchiura; Noboru Fukuhara; Toshio Ishihara, both of Tsukuba, all of Japan

[73] Assignee: Sumitomo Chemical Company, Limited, Osaka, Japan

[21] Appl. No.: 368,872

[22] Filed: Jan. 5, 1995

[30] Foreign Application Priority Data

Jan. 7, 1994 [JP] Japan .................................. 6-000461

[51] Int. Cl.⁶ ................................................ C30B 29/40
[52] U.S. Cl. ........................... 117/89; 117/104; 117/954; 437/105
[58] Field of Search ......................... 117/954, 104, 117/89; 437/105, 107

[56] References Cited

U.S. PATENT DOCUMENTS

| | | |
|---|---|---|
| 4,717,597 | 1/1988 | Johnson et al. . |
| 5,098,857 | 3/1992 | Kuech et al. . |

FOREIGN PATENT DOCUMENTS

| | | |
|---|---|---|
| 0106537 | 4/1984 | European Pat. Off. . |
| 1220432 | 9/1989 | Japan . |
| 2043365 | 2/1990 | Japan . |
| 3022519 | 1/1991 | Japan . |
| 01179411 | 9/1994 | Japan ..................................... 117/954 |
| 06275523 | 9/1994 | Japan ..................................... 117/954 |
| 2055774 | 3/1981 | United Kingdom . |
| WO9215113 | 9/1992 | WIPO . |

*Primary Examiner*—Robert Kunemund
*Attorney, Agent, or Firm*—Birch, Stewart, Kolasch & Birch, LLP

[57] ABSTRACT

A process for crystal growth of III-V group compound semiconductor, which comprises pyrolyzing, in a gas phase, a material consisting of an organometallic compound and/or a hydride in the presence of an organic compound containing an oxygen atom-carbon atom direct bond, used as a dopant to grow a III-V group compound semiconductor crystal layer containing at least aluminum, of high electric resistance. Said process can grow a compound semiconductor layer of high electric resistance by the use of a dopant which enables the independent controls of oxygen concentration and aluminum concentration and which has a small effect of oxygen remaining.

15 Claims, 6 Drawing Sheets

PROCESS FOR CRYSTAL GROWTH OF III-V GROUP COMPOUND SEMICONDUCTOR

BACKGROUND OF THE INVENTION

1. Field of the Invention

The present invention relates to a process for crystal growth of III-V group compound semiconductor containing a compound semiconductor crystal layer of high electric resistance.

2. Description of the Related Art

Electronic devices using a compound semiconductor must have an electric resistance between elements as large as possible in order to prevent a malfunction and a breakdown caused by leakage current between elements.

Progress in integration degree, however, makes narrower the distance between electronic elements and consequently the electric leakage tends to occur between the elements.

Reliable insulation (isolation) between elements can achieve high performance and high integration simultaneously. Therefore, it has been desired strongly to develop a process for growing a compound semiconductor crystal layer enabling such reliable insulation between elements.

To satisfy the above desire, it has been conducted to grow a crystal layer of high electric resistance by crystal growth using molecular beam epitaxy (hereinafter referred to as MBE, in some cases), metal organic chemical vapor deposition (hereinafter referred to as MOCVD, in some cases) or the like.

The processes employed conventionally to grow a crystal layer of high electric resistance include a process of doping an AlGaAs layer with a dopant such as oxygen, a transition metal or the like. It is known that oxygen or a transition metal forms a deep level in the forbidden band of a semiconductor. Therefore, by forming a deep level of said element in a large amount in an Al-containing crystal by utilizing the high activity of Al to said element, a crystal layer of high electric resistance can be grown in said crystal. As the specific processes to grow a crystal layer of high electric resistance, there are known, for example, a process using oxygen gas as an oxygen dopant; a process using, as an oxygen dopant, an organometallic compound having an aluminum atom-oxygen atom direct bond [Japanese Patent Application Kokai (Laid-Open) No. 1-220432]; and a process using, as a dopant, an organometallic compound having an aluminum atom-oxygen atom direct bond or an organometallic compound containing a transition metal [Japanese Patent Application Kokai (Laid-Open) No. 3-22519].

However, when oxygen gas is used as a dopant, oxygen tends to remain in the reaction furnace owing to the high reactivity, which may invite the oxygen incorporation into the upper crystal layer right on the high resistance layer and the consequent deterioration of crystal quality. Hereinafter, that "oxygen tends to remain" is referred to as "a large effect of oxygen remaining" and that "oxygen is unlikely to remain" is referred to as "a small effect of oxygen remaining", in some cases.

When an organometallic compound having an aluminum atom-oxygen atom direct bond is used as an oxygen dopant, there has been a problem that oxygen concentration and aluminum concentration cannot be controlled independently. Further, since the organo-metallic compound generally contains a dimer and a trimer each having a vapor pressure different from that of the monomer, there has also been a problem that the vaporization behavior of the compound is unstable and it is impossible to obtain a given oxygen concentration continuously.

An object of the present invention is to provide a process for growing a compound semiconductor crystal layer having a high electric resistance, by the use of a dopant which enables the independent controls of oxygen concentration and aluminum concentration and which has a small effect of oxygen remaining.

SUMMARY OF THE INVENTION

The present inventors made a study in order to solve the above-mentioned problems and, as a result, found out that the effect of oxygen remaining is small when a particular organic ether compound is used as a dopant. The finding has led to the completion of the present invention.

The present invention comprises the following aspects.

(1) A process for crystal growth of III-V group compound semiconductor, which comprises pyrolyzing, in a gas phase, at least one material selected from the group consisting of an organometallic compound containing a III group element, a hydride containing a III group element, an organometallic compound containing a V group element and a hydride containing a V group element, said at least one material containing, as a whole, a III group element, a V group element and at least aluminum, in the presence of an organic compound having an oxygen atom-carbon atom direct bond, used as a dopant to grow a III-V group compound semiconductor crystal layer.

(2) A process according to the above aspect (1), wherein the III-V group compound semiconductor crystal layer is a $Al_xGa_{(1-x)}As$ crystal layer ($0<x<1$).

(3) A process according to the above aspect (1) or (2), wherein the organic compound is a straight-chain ether represented by formula (I).

$$R_1—O—R_2 \tag{I}$$

(wherein $R_1$ and $R_2$ are independently a saturated or unsaturated monovalent hydrocarbon group having 1–10 carbon atoms.)

(4) A process according to the above aspect (1) or (2), wherein the organic compound is a cyclic ether represented by formula (II).

$$[—(R_3—O—)_n—] \tag{II}$$

(wherein $R_3$ is a divalent hydrocarbon group having 1–10 carbon atoms and n is an integer of 1–3.)

(5) A process according to the above aspect (1) or (2), wherein the organic compound is a coordination compound in which a straight-chain ether represented by formula (I) or a cyclic ether represented by formula (II) coordinates to a trialkyl aluminum.

$$R_1—O—R_2 \quad (I)$$

(wherein $R_1$ and $R_2$ are independently a saturated or unsaturated monovalent hydrocarbon group having 1–10 carbon atoms.)

$$[—(R_3—O—)_n—] \tag{II}$$

(wherein $R_3$ is a divalent hydrocarbon group having 1–10 carbon atoms and n is an integer of 1–3.)

The present process can grow a compound semiconductor crystal layer of high electric resistance by the use of a dopant which enables the independent controls of oxygen concentration and aluminum concentration and which shows stable vaporization behavior and has a small effect of oxygen remaining; can further grow thereon a compound semiconductor crystal layer of excellent crystal quality and excellent electrical properties; therefore, has a high industrial value.

BRIEF DESCRIPTION OF THE DRAWINGS

FIG. 10 is a graph showing the static characteristic of the recess gate type FET of

COMPARATIVE EXAMPLE 1.

DETAILED DESCRIPTION OF THE INVENTION

The present invention is hereinafter described in detail.

In the present process for crystal growth of III–V group compound semiconductor, there is used, as the material, an organometallic compound and/or a hydride each containing a III group element and/or a V group element. The material contains, as a whole, both of a III group element and a V group element and at least aluminum.

The organometallic compound includes trimethyl gallium (hereinafter referred to as TMG, in some cases), triethyl gallium (hereinafter referred to as TEG, in some cases), trimethyl aluminum (hereinafter referred to as TMA, in some cases), triethyl aluminum (hereinafter referred to as TEA, in some cases), trimethyl indium (hereinafter referred to as TMI, in some cases), etc.

The hydride includes arsine ($AsH_3$), phosphine ($PH_3$), etc.

In the present invention, the III–V group compound semiconductor crystals contain a III–V group compound semiconductor crystal layer containing at least aluminum, of high electric resistance. Hence, the present invention is characterized by using, as a dopant, an organic compound having an oxygen atom-carbon atom direct bond to grow a III–V group compound semiconductor crystal layer containing at least aluminum, of high electric resistance.

Specific examples of the III–V group compound semiconductor crystal layer containing at least aluminum, of high electric resistance are an $Al_xGa_{(1-x)}As$ crystal layer ($0<x<1$), an $Al_xIn_{(1-x)}As$ crystal layer ($0<x<1$), an $Al_xGa_yIn_{(1-x-y)}As$ crystal layer ($0<x<1$, $0<y<1$, $0<x+y<1$) and an $Al_xGa_yIn_{(1-x-y)}P$ crystal layer ($0<x<1$, $0<y<1$, $0<x+y<1$). Of these, the $Al_xGa_{(1-x)}As$ crystal layer ($0<x<1$) is preferable.

In the $Al_xGa_{(1-x)}As$ crystal layer, when x is small, the degree of its oxygen incorporation is low and the layer is unable to have a high resistivity; and when x is large, the layer tends to be oxidized and is unstable. Therefore, $0.1 \leq x \leq 0.8$ is preferable and $0.2 \leq x \leq 0.7$ is particularly preferable.

The oxygen concentration in the III–V group compound semiconductor crystal layer containing at least aluminum, of high electric resistance varies depending upon the purity of the crystal but is preferably $1 \times 10^{16}/cm^3$ or more, more preferably $1 \times 10^{17}/cm^3$ or more. The upper limit of said oxygen concentration varies depending upon the conditions for growth of said layer, etc. and cannot be determined at a specific value, but is preferably about $1 \times 10^{21}/cm^3$ or less, more preferably about $1 \times 10^{20}/cm^3$ or less because too high an oxygen concentration makes rough the surface of said layer.

In the present invention, the organic compound having an oxygen atom-carbon atom direct bond, used as a dopant includes a straight-chain ether represented by formula (I).

$$R_1\text{—}O\text{—}R_2 \qquad (I)$$

(wherein $R_1$ and $R_2$ are independently a saturated or unsaturated monovalent hydrocarbon group having 1–10 carbon atoms.)

$R_1$ and $R_2$ are each exemplified by a methyl group, an ethyl group, an n-propyl group, an isopropyl group, an n-butyl group, a sec-butyl group and an n-hexyl group.

The above organic compound also includes a cyclic ether represented by formula (II).

$$\text{—}(R_3\text{—}O\text{—})_n\text{—} \qquad (II)$$

(wherein $R_3$ is a divalent hydrocarbon group having 1–10 carbon atoms and n is an integer of 1–3.)

Specific examples of the cyclic ether are tetrahydrofuran, dioxane, trioxane and derivatives thereof.

The organic compound further includes a coordination compound in which a straight-chain ether represented by formula (I) or a cyclic ether represented by formula (II) coordinates to a trialkyl aluminum. Specific examples of the coordination compound include trimethyl aluminum etherate ($TMA.Et_2O$), etc.

An oxygen-containing organic compound such as ether or the like has good vaporization behavior and accordingly can be fed reproducibly at a controlled rate. Further, when such an organic compound is used in a crystal growth process, only the oxygen of said compound is incorporated into a compound semiconductor crystal layer formed because of the high reactivity of the aluminum contained in the layer. Furthermore, when such an organic compound is used, no oxygen remains in a reactor, unlike the case of using oxygen gas. Consequently, even when a crystal layer of high purity is grown successively, the crystal contains no oxygen, has no high resistance, and is presumed to cause no reduction in electrical properties.

The above-mentioned material is pyrolyzed in a reactor, and gas-phase epitaxial crystal growth on substrate takes place. The oxygen content in the material is preferably low in order to obtain a high crystal purity.

In doping, the dopant can be fed by bubbling an organic compound which is a liquid at room temperature, or by using a diluted gas of an organic compound which is a gas at room temperature, with hydrogen or the like.

The present invention is hereinafter described more specifically by way of Examples. However, the present invention is not restricted to the Examples.

EXAMPLE 1

Figure 1:
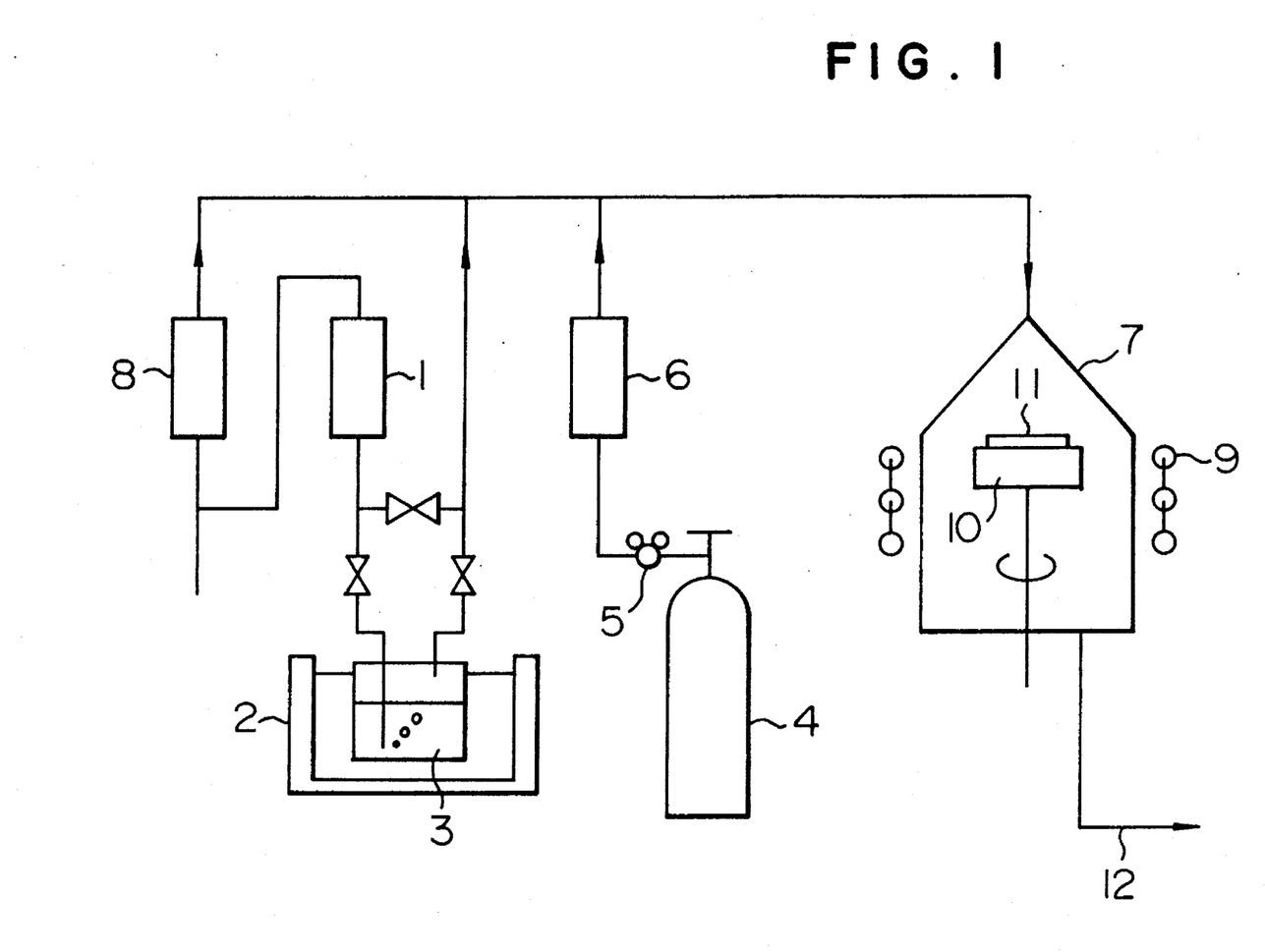
FIG. 1 is a schematic view of an example of the chemical vapor deposition apparatus used in the practice of the present invention.

There was used an apparatus comprising, in addition to the apparatus shown in FIG. 1, two more mechanisms similar to the arsine-feeding section 4 of FIG. 1 apparatus, capable of feeding disilane diluted with hydrogen to a concentration of 20 moles ppm and two more mechanisms similar to the trimethyl gallium-feeding section 3 of FIG. 1 apparatus, capable of feeding trimethyl aluminum. Using a semi-insulating GaAs single crystal as a substrate 11, crystal growth was conducted under the following conditions to form a non-doped GaAs layer on the substrate 11 in a thickness of 3,000 Å. The crystal growth rate was 450 Å/min.

Pressure in reactor=$5.33\times10^3$ Pa (40 Torr)

Substrate temperature=700° C.

TMG-feeding rate=$6.3\times10^{-4}$ mole/min

Carrier gas (Hydrogen)-feeding rate=80 liters/min $AsH_3$-feeding rate=$2.0\times10^{-3}$ mole/min (corresponds to As/Ga=30)

In FIG. 1, numerals 1, 6 and 8 each represent a mass flow controller; numeral 2 represents a thermostatic bath; numeral 5 represents a reducing valve; numeral 7 represents a reactor; numeral 9 represents a radio frequency heating coil; numeral 10 represents a susceptor; and numeral 12 represents a vent line.

Then, under the following conditions was formed an AlGaAs layer of high electric resistance on the non-doped GaAs layer in a thickness of 5,000 Å. The crystal growth rate was 250 Å/min. The layer had a composition of $Al_xGa_{(1-x)}As$ (x=0.7).

TMG-feeding rate=$1.2\times10^{-4}$ mole/min $AsH_3$-feeding rate=$2.0\times10^{-3}$ mole/min TMA-feeding rate=$1.9\times10^{-4}$ mole/min Di-n-hexyl ether [$(n—C_6H_{13})_2O$]-feeding rate=$1.1\times10^{-6}$ mole/min Then, the feeding of di-n-hexyl ether was stopped; TMG was fed at a rate of $2.1\times10^{-4}$ mole/min; TMA was fed at a rate of $3.9\times10^{-5}$ mole/min; $AsH_3$ was fed at a rate of $4.0\times10^{-3}$ mole/min; thereby, an $Al_xGa_{(1-x)}As$ layer (x=0.2) was formed on the $Al_xGa_{(1-x)}As$ layer (x=0.7) in a thickness of 5,000 Å at a growth rate of 200 Å/min.

A test conducted separately indicated that the $Al_xGa_{(1-x)}As$ layer (x=0.2) had a residual carrier concentration of about $1\times10^{15}/cm^3$ and was a p type.

Then, the feeding of TMA was stopped; disilane was fed at a rate of $1.4\times10^{-8}$ mole/min; TMG was fed at a rate of $2.1\times10^{-4}$ mole/min; $AsH_3$ was fed at a rate of $4.0\times10^{-3}$ mole/min; thereby, a GaAs layer of n type was formed on the $Al_xGa_{(1-x)}As$ layer (x=0.2) in a thickness of 3,000 Å at a growth rate of 450 Å/min. The feeding of TMG and disilane was stopped to terminate the crystal growth; the system was cooled to 550° C. and the feeding of arsine was stopped; the system was cooled to around room temperature; and the resulting sample was taken out of the reactor.

Figure 2:
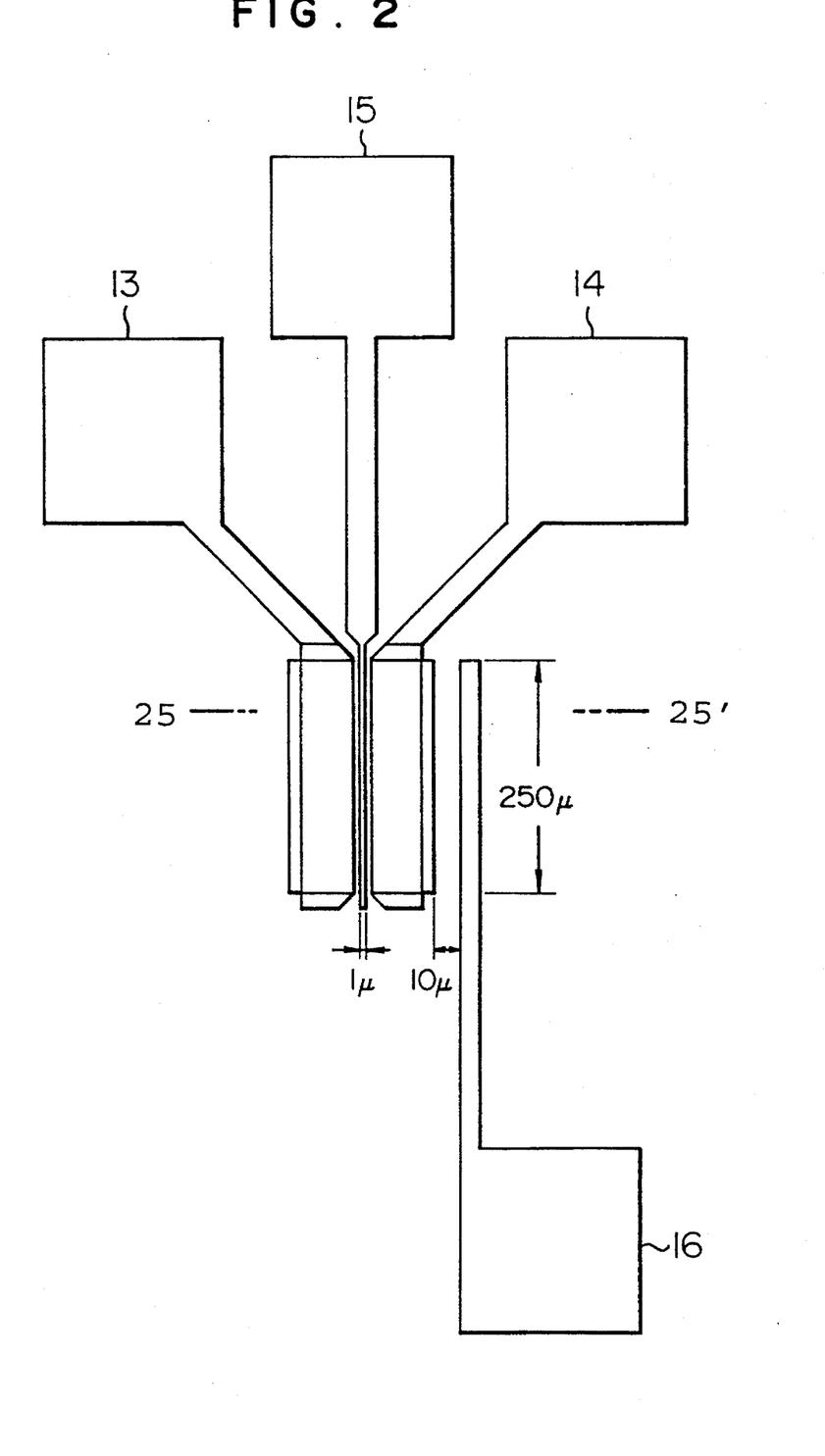
FIG. 2 is a plan view of a device pattern for evaluation of recess gate type FET.
Figure 3:
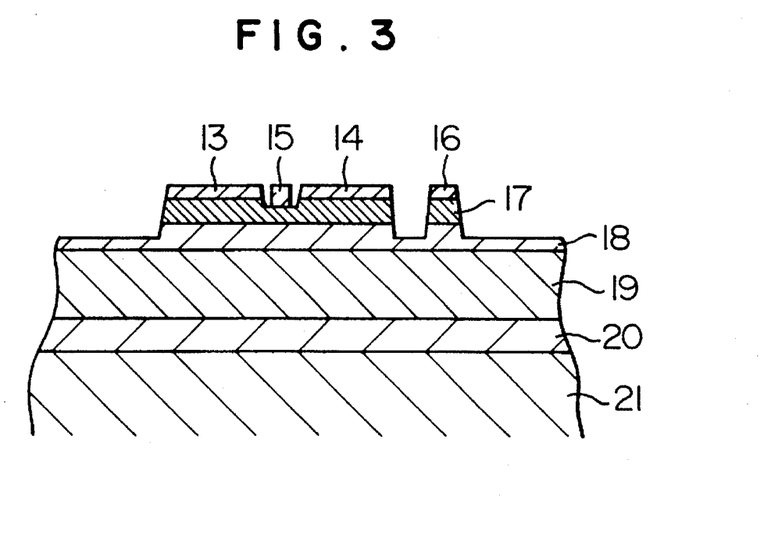
FIG. 3 is a schematic sectional view of a device pattern for evaluation of recess gate type FET.

By using part of the sample, there was prepared a recess gate type FET as shown in the plan view of FIG. 2, provided with a source electrode 13, a drain electrode 14 and a gate electrode 15 of 1 µm in gate length and 200 µm in gate width but not provided with a side gate 16 as shown in FIG. 2. In this FET, the section, when schematically viewed at the A—A' line of FIG. 2, consisted of a GaAs substrate 21, a GaAs layer 20, an oxygen-doped AlGaAs layer 19, a high-purity AlGaAs layer 18 and a Si-doped GaAs layer 17 of n type in this order, as shown in FIG. 3.

Figure 4:
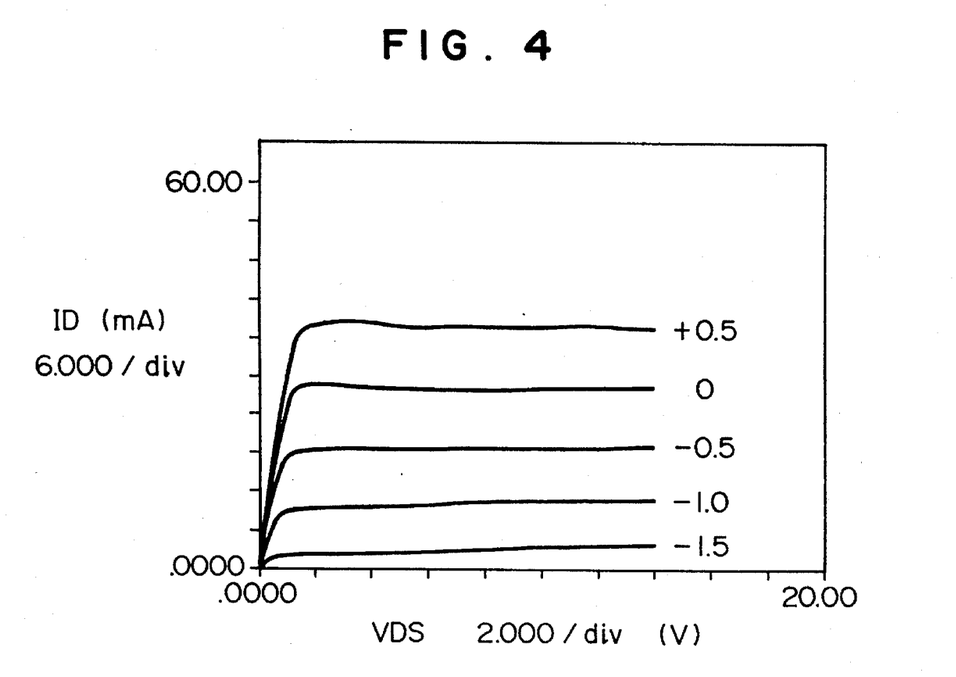
FIG. 4 is a graph showing the static characteristic of the recess gate type FET of Example 1.

The FET was measured for static characteristic. There was obtained a good static characteristic as shown in FIG. 4, showing a small hysteresis and no kink. In FIG. 4, the axis of abscissas shows a drain voltage (V); the axis of ordinates shows a drain current (mA); and the parameter is a gate voltage (V).

Next, in preparation of the above FET, part of the sample was provided with neither gate electrode nor side gate electrode; a groove of 0.35 µm in depth was made between the source electrode and the drain electrode (the distance between the two electrodes=about 20 µm); and leakage current and breakdown voltage were measured between the drain electrode and the source electrode. The leakage current when 10 V was applied, was $2.2\times10^{-10}$ A; and the breakdown voltage when $1\times10^{-6}$ A was applied, was 83.7 V. This indicates that a good buffer layer of very high electric resistance was formed.

Figure 5:
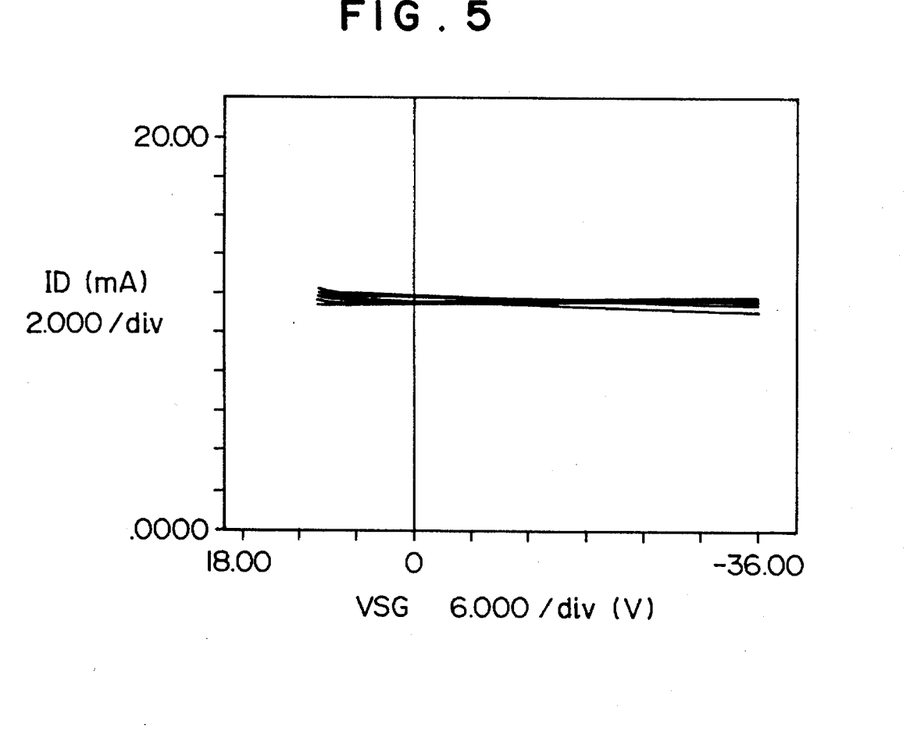
FIG. 5 is a graph showing the dependency of drain current on side gate voltage, of the recess gate type FET provided with a side gate electrode, of Example 1.

Next, there was prepared a sample as shown in FIG. 2, wherein a side gate electrode 16 was provided in the vicinity of the above FET. A voltage was applied using the side gate electrode as a side gate, to examine the effect of side gate voltage on drain current of FET. As shown in FIG. 5, there was substantially no effect of side gate voltage on drain current. The parameter was a drain voltage and was 2.5–15 V (step=2.5 V). Incidentally, in FIG. 5, the axis of abscissas shows a side gate voltage (V) and the axis of ordinates shows a drain current (mA). FIG. 5 indicates that the buffer layer in the sample had a good property for the separation of adjacent elements.

EXAMPLE 2

Crystal growth was conducted in the same manner as in Example 1 except that in the formation of AlGaAs layer of high electric resistance, TMG was fed at a rate of $2.0\times10^{-4}$ mole/min and TMA was fed at a rate of $1.4\times10^{-4}$ mole/min to form an $Al_xGa_{(1-x)}As$ layer (x=0.5).

Figure 6:
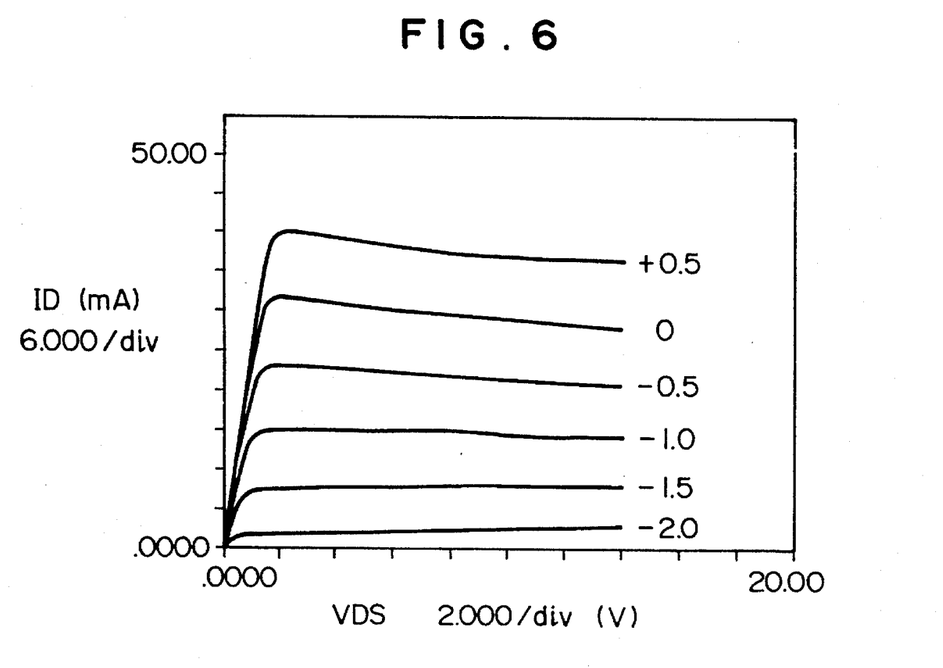
FIG. 6 is a graph showing the static characteristic of the recess gate type FET of Example 2.

Using the above-obtained crystals, a recess gate type FET was prepared in the same manner as in Example 1 and measured for static characteristic. There was obtained a good static characteristic as shown in FIG. 6, showing a small hysteresis and no kink. Next, leakage current and breakdown voltage were measured in the same manner as in Example 1. The leakage current when 10 V was applied, was $8.5\times10^{-10}$ A; and the breakdown voltage when $1\times10^{-6}$ A was applied, was 77.7 V. This indicates that a good buffer layer of very high electric resistance was formed.

Figure 7:
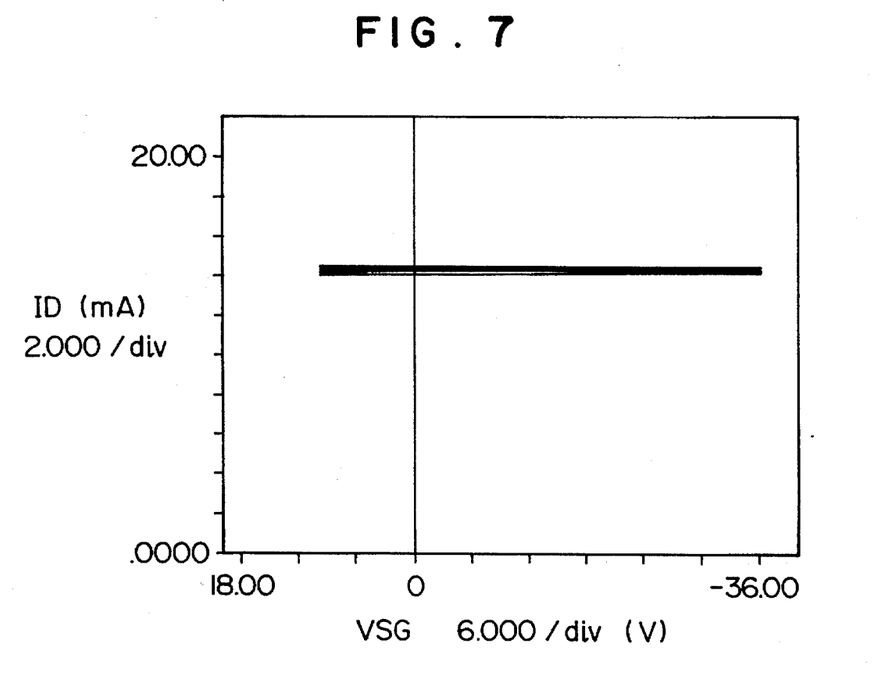
FIG. 7 is a graph showing the dependency of drain current on side gate voltage, of the recess gate type FET provided with a side gate electrode, of Example 2.

Next, side gate characteristic was measured in the same manner as in Example 1. As a result, there was obtained an excellent side gate characteristic similar to that of Example 1, as shown in FIG. 7. The parameter was the same as in Example 1. This indicates that the buffer layer in the sample had a good property for the separation of adjacent elements.

EXAMPLE 3

Crystal growth was conducted in the same manner as in Example 1 except that in the formation of AlGaAs layer of high electric resistance, di-n-hexyl ether as oxygen dopant was fed at a rate of $5.6 \times 10^{-6}$ mole/min, TMG was fed at a rate of $2.8 \times 10^{-4}$ mole/min, and TMA was fed at a rate of $8.3 \times 10^{-5}$ mole/min to form an $Al_xGa_{(1-x)}As$ layer (x=0.3).

Using the above-obtained crystals, leakage current and breakdown voltage were measured in the same manner as in Example 1. The leakage current when 10 V was applied, was $9.2 \times 10^{-10}$ A; and the breakdown voltage when $1 \times 10^{-6}$ A was applied, was 57.0 V. This indicates that a good buffer layer of very high electric resistance was formed.

EXAMPLE 4

Trimethyl aluminum etherate (TMA.Et$_2$O) (a liquid coordination compound) was produced by adding an equimolar amount of diethyl ether to commercial TMA by bubbling.

Crystal growth was conducted in the same manner as in Example 1 except that in the formation of AlGaAs layer of high electric resistance, oxygen doping was conducted by, in place of using di-n-hexyl ether, bubbling the above-produced TMA.Et$_2$O with 50 sccm of a carrier gas (hydrogen) at a constant temperature of 35° C., and TMG and TMA were fed in the same manner as in Example 3 to form an $Al_xGa_{(1-x)}As$ layer (x=0.3).

Figure 8:
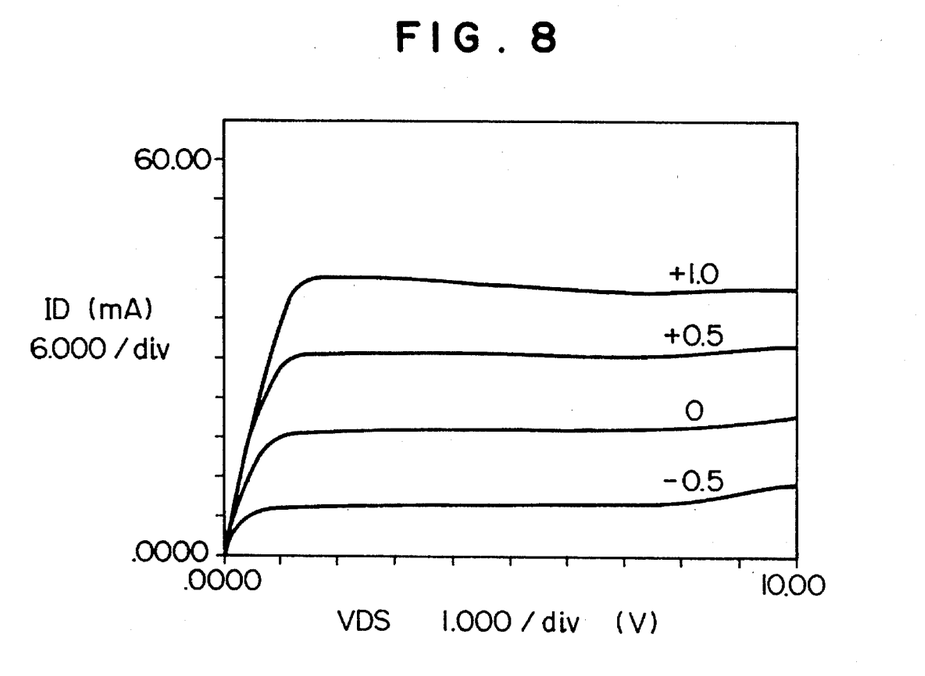
FIG. 8 is a graph showing the static characteristic of the recess gate type FET of Example 4.

Using the above-obtained crystals, a recess gate type FET was prepared in the same manner as in Example 1 and measured for static characteristic. There was obtained a good static characteristic as shown in FIG. 8, showing a small hysteresis and no kink. Next, leakage current and breakdown voltage were measured in the same manner as in Example 1. The leakage current when 10 V was applied, was $2 \times 10^{-10}$ A; and the breakdown voltage when $1 \times 10^{-6}$ A was applied, was 65.0 V. This indicates that a good buffer layer of very high electric resistance was formed.

Figure 9:
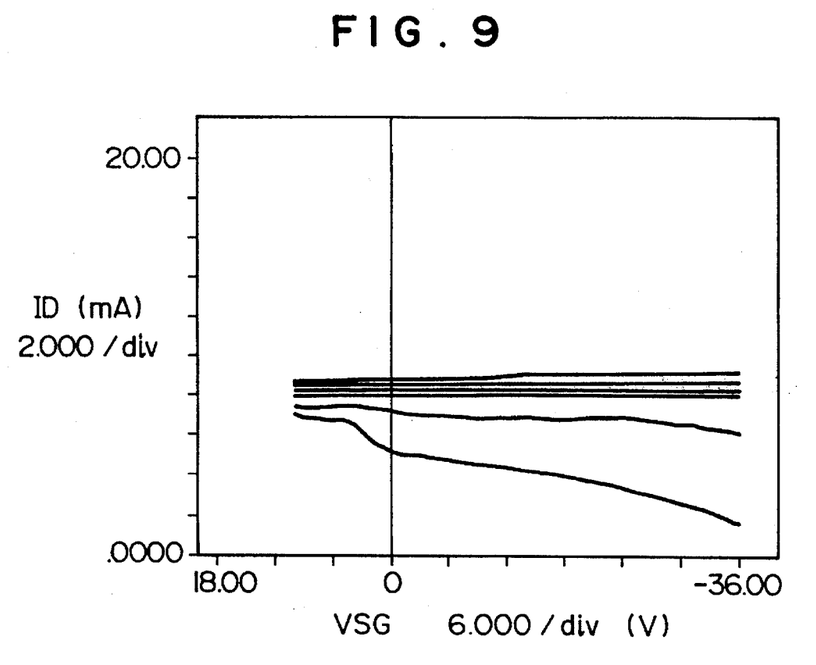
FIG. 9 is a graph showing the dependency of drain current on side gate voltage, of the recess gate type FET provided with a side gate electrode, of Example 4.

Next, side gate characteristic was measured in the same manner as in Example 1. As a result, there was obtained an excellent side gate characteristic similar to that of Example 1, as shown in FIG. 9. The parameter was the same as in Example 1. This indicates that the buffer layer in the sample had a good property for the separation of adjacent elements.

Comparative Example 1

Crystal growth was conducted in the same manner as in Example 1 except that an $Al_xGa_{(1-x)}As$ layer (x=0.5) was formed using no ether compound.

Figure 10:
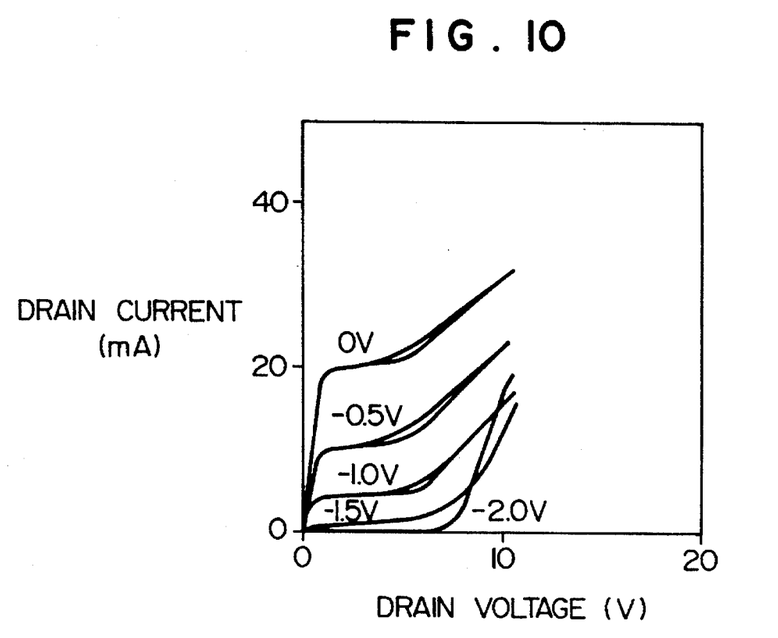

Using the above-obtained crystals, a recess gate type FET was prepared in the same manner as in Example 1 and measured for static characteristic. There was obtained a static characteristic as shown in FIG. 10, showing a sharp increase of drain current (so-called kink) at a drain voltage of about 10 V. Next, leakage current was measured in the same manner as in Example 1. The leakage current when 10 V was applied, was $1.4 \times 10^{-6}$ A. This indicates that the FET had an insufficient buffer resistance.

Then, side gate characteristic was measured in the same manner as in Example 1. The drain current varied greatly depending upon the side gate voltage, and the separation between elements was inferior. As is appreciated from the above, when no AlGaAs layer of high electric resistance is used, buffer resistance and FET characteristics are inferior and the separation between elements is also inferior.

What is claimed is:

1. A process for crystal growth of III–V group compound semiconductor, which comprises pyrolyzing, in a gas phase, at least one material selected from the group consisting of an organometallic compound containing a III group element, a hydride containing a III group element, an organometallic compound containing a V group element and a hydride containing a V group element, said at least one material containing, as a whole, a III group element, a V group element and at least aluminum, in the presence of an organic compound having an oxygen atom-carbon atom direct bond, used as a dopant to grow a III–V group compound semiconductor crystal layer.

2. A process according to claim 1, wherein the III–V group compound semiconductor crystal layer is a $Al_xGa_{(1-x)}As$ crystal layer (0<x<1).

3. A process according to claim 2, wherein the organic compound is a straight-chain ether represented by formula (I):

$$R_1\text{—}O\text{—}R_2 \qquad (I)$$

(wherein $R_1$ and $R_2$ are independently a saturated or unsaturated monovalent hydrocarbon group having 1–10 carbon atoms.

4. A process according to claim 2, wherein the organic compound is a cyclic ether represented by formula (II):

$$\left[ \text{—}(R_3\text{—}O\text{—})_n \text{—} \right] \qquad (II)$$

wherein $R_3$ is a divalent hydrocarbon group having 1–10 carbon atoms and n is an integer of 1–3.

5. A process according to claim 2, wherein the organic compound is a coordination compound in which a straight-chain ether represented by formula (I) coordinates to trialkyl aluminum:

$$R_1\text{—}O\text{—}R_2 \qquad (I)$$

wherein $R_1$ and $R_2$ are independently a saturated or unsaturated monovalent hydrocarbon group having 1–10 carbon atoms.

6. A process according to claim 2, wherein the organic compound is a coordination compound in which a cyclic ether represented by formula (II) coordinates to trialkyl aluminum:

$$\left[ \text{—}(R_3\text{—}O\text{—})_n \text{—} \right] \qquad (II)$$

wherein $R_3$ is a divalent hydrocarbon group having 1–10 carbon atoms and n is an integer of 1–3.

7. A process according to claim 1, wherein said at least one material comprises a group III element-containing organometallic compound, a group V element-containing hydride, and an organo-aluminum compound.

8. A process according to claim 7, wherein said at least one material comprises a trimethyl- or triethyl-gallium, a trimethyl- or triethyl aluminum, and arsine.

9. A process according to claim 1, wherein said crystal layer is grown on a substrate.

10. A process according to claim 9, wherein said substrate is GaAs.

11. A process according to claim 1, wherein said organic compound is selected from the group consisting of di-n-hexyl ether, tetrahydrofuran, dioxane, and trioxane.

12. A process according to claim 3, wherein $R_1$ and $R_2$ are each independently selected from the group consisting of methyl, ethyl, n-propyl, isopropyl, n-butyl, sec-butyl, and n-hexyl.

13. A process according to claim 5, wherein $R_1$ and $R_2$ are each independently selected from the group consisting of methyl, ethyl, n-propyl, isopropyl, n-butyl, sec-butyl, and n-hexyl.

14. A process according to claim 1, wherein said organic compound is di-n-hexyl ether or trimethyl aluminum etherate.

15. A process for making a III–V group semiconductor, which comprises:

pyrolyzing in a gas phase a III–V group-containing composition, which comprises at least one group III element-containing organometallic compound or hydride and at least one group V element-containing organometallic compound or hydride, wherein said composition contains at least a III group element, a V group element, and aluminum, in the presence of an oxygen doping organic ether compound or aluminum coordinated organic ether compound, so as to grow an oxygen doped III–V group compound semiconductor crystal.

* * * * *